US010813233B2

(12) United States Patent
Ryu et al.

(10) Patent No.: US 10,813,233 B2
(45) Date of Patent: Oct. 20, 2020

(54) DISPLAY DEVICE

(71) Applicant: LG ELECTRONICS INC., Seoul (KR)

(72) Inventors: Jaeuk Ryu, Seoul (KR); Chunsoo Chang, Seoul (KR); Honghae Do, Seoul (KR); Sangmoon Hwang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/378,270

(22) Filed: Apr. 8, 2019

(65) Prior Publication Data

US 2019/0327842 A1    Oct. 24, 2019

(30) Foreign Application Priority Data

Apr. 23, 2018  (KR) .................. 10-2018-0046927
Aug. 2, 2018   (KR) .................. 10-2018-0090188

(51) Int. Cl.
| *H05K 7/00* | (2006.01) |
| *H05K 5/00* | (2006.01) |
| *H05K 5/02* | (2006.01) |
| *H05K 5/03* | (2006.01) |
| *H05K 7/20* | (2006.01) |

(52) U.S. Cl.
CPC .......... *H05K 5/0017* (2013.01); *H05K 5/0217* (2013.01); *H05K 5/03* (2013.01); *H05K 7/20954* (2013.01)

(58) Field of Classification Search
None
See application file for complete search history.

(56) References Cited

U.S. PATENT DOCUMENTS

| 9,568,757 | B2* | 2/2017 | Lee ................... G02F 1/133308 |
| 2013/0194781 | A1* | 8/2013 | Kim .................... H04M 1/0266 |
| | | | 362/97.1 |
| 2016/0353587 | A1 | 12/2016 | Shin et al. |
| 2017/0192163 | A1* | 7/2017 | Oh ....................... G02B 6/0088 |
| 2017/0227808 | A1* | 8/2017 | Lee ................... G02F 1/133308 |
| 2017/0299913 | A1* | 10/2017 | Choi .................... G02B 6/0088 |
| 2017/0318694 | A1 | 11/2017 | Yun et al. |
| 2017/0352831 | A1 | 12/2017 | Kwon et al. |

(Continued)

OTHER PUBLICATIONS

European Patent Office Application Serial No. 19166868.0, Search Report dated Sep. 6, 2019, 11 pages.

*Primary Examiner* — Courtney L Smith
*Assistant Examiner* — Rashen E Morrison
(74) *Attorney, Agent, or Firm* — Lee, Hong, Degerman, Kang & Waimey PC

(57) ABSTRACT

The present disclosure relates to a display device with a simple structure and an improved appearance. The present disclosure provides a display panel; an inner plate attached to a rear portion of the display panel; a rear cover configured to cover a rear portion of the inner plate, the rear cover including a first cover adhering to the rear portion of the inner plate and a second cover spaced apart from the rear portion of the inner plate to form a space within the display device; and a component module including components driving the display panel, the component module being configured to be inserted into the space through a lower portion of the display device and to directly engage with a mount disposed within the second cover.

19 Claims, 16 Drawing Sheets

(56) References Cited

U.S. PATENT DOCUMENTS

| | | | |
|---|---|---|---|
| 2018/0024396 A1 | 1/2018 | Kang | |
| 2018/0054553 A1* | 2/2018 | Choi | H04N 5/247 |
| 2018/0088398 A1* | 3/2018 | Lee | H05K 7/20145 |
| 2019/0223303 A1* | 7/2019 | Chang | F16M 11/22 |
| 2019/0327842 A1* | 10/2019 | Ryu | G06F 1/1656 |
| 2020/0027391 A1* | 1/2020 | Cho | H01L 27/3244 |

\* cited by examiner

DISPLAY DEVICE

CROSS-REFERENCE TO RELATED APPLICATIONS

Pursuant to 35 U.S.C. § 119(a), this application claims the benefit of earlier filing date and right of priority to Korean Patent Application Nos. 10-2018-0046927, filed on Apr. 23, 2018 and 10-2018-0090188, filed on Aug. 2, 2018, the contents of which are all hereby incorporated by reference herein in their entirety.

BACKGROUND OF THE DISCLOSURE

1. Field of the Disclosure

The present disclosure relates to a display device, and more particularly, to the overall design of a display device.

2. Background of the Disclosure

A display device is a device with functions of receiving, processing and displaying an image that a user can view. For example, the display device receives a broadcast, which is selected by a user from among broadcast signals broadcasted by a broadcasting station, separates an image signal from the received signal, and then displays the separated image signal on a display.

Recently, not only the function of the display device but the appearance thereof has been developed. For example, the display device has been developed such that its display panel and peripherals thereof become transparent while the display device is in an inactive state, i.e., while the display device displays no image.

However, such additional functions and appearances increase the complexity of display devices so that user satisfaction and reputation may decrease. In addition, the additional functions and appearances also require a number of additional processes and components. That is, when display devices are manufactured, the additional functions and appearances may cause decrease in the productivity and increase in the unit cost of production.

SUMMARY OF THE DISCLOSURE

The present disclosure provides a solution to the aforementioned problem. In particular, an object of the present disclosure is to provide a simple design for a display device.

Another object of the present disclosure is to provide a display device with an improved appearance.

The present disclosure provides a display panel; an inner plate attached to a rear portion of the display panel; a rear cover configured to cover a rear portion of the inner plate, the rear cover including a first cover adhering to the rear portion of the inner plate and a second cover spaced apart from the rear portion of the inner plate to form a space within the display device; and a component module including components driving the display panel, the component module being configured to be inserted into the space through a lower portion of the display device and to directly engage with a mount disposed within the second cover.

The mount may be installed on the inner plate to be disposed within the space.

In addition, the first and second covers of the rear cover may be formed as an integral part. The first cover of the rear cover may be configured to cover upper portions of the display panel and inner plate, and the second cover of the rear cover may be configured to cover lower portions of the display panel and inner plate. The second cover of the rear cover may include an opening formed in a bottom portion thereof and configured such that the component module is inserted therethrough. The rear cover may further include a bottom cover configured to selectively seal the opening.

The component module may include: a bracket including a plate member with a predetermined size; and the components installed on the bracket. The bracket may include a recess formed in a body thereof and configured to accommodate the components. In addition, the bracket may further include a partition wall configured to isolate the components from each other.

The component module may include a side flap provided in a side portion thereof and configured to couple to the mount by directly engaging with the mount with no fastening member. The side flap may include a clamp configured to elastically hold the mount. In addition, the mount may include a body extended toward the component module and a groove formed on an outer surface of the body where the clamp is inserted.

More specifically, the component module may include: a first flap provided in a side portion of the component module; and a second flap provided in the side portion and located below the first flap. In this case, the second flap may be disposed further away from the side portion than the first flap.

The component module may further include a guide configured to be in contact with the mount and guide a sliding motion of the component module when the component module is inserted. The guide may include a first guide disposed between the first and second flaps and configured to be contact in a mount to be coupled to the second flap. In addition, the guide may further include a second guide disposed above the first flap and configured to be in contact with a mount to be coupled to the first flap.

The component module may include multiple fastening holes formed in a lower portion thereof for the coupling between the inner plate and component module. The fastening holes may be configured to be exposed from the second cover to the outside after the component module is inserted into the space. A bottom portion of the second cover may be tilted upward so that the fastening holes are exposed.

The component module may further include a thermal pad interposed between the components and second cover and configured to deliver heat generated by the components to the second cover.

The application scope of the examples to be described in the present disclosure will become apparent from the following detailed description. However, it should be understood that the following configurations are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings, which are given by illustration only, and thus are not limitative of the present disclosure, and wherein.

DETAILED DESCRIPTION

Figure 1:
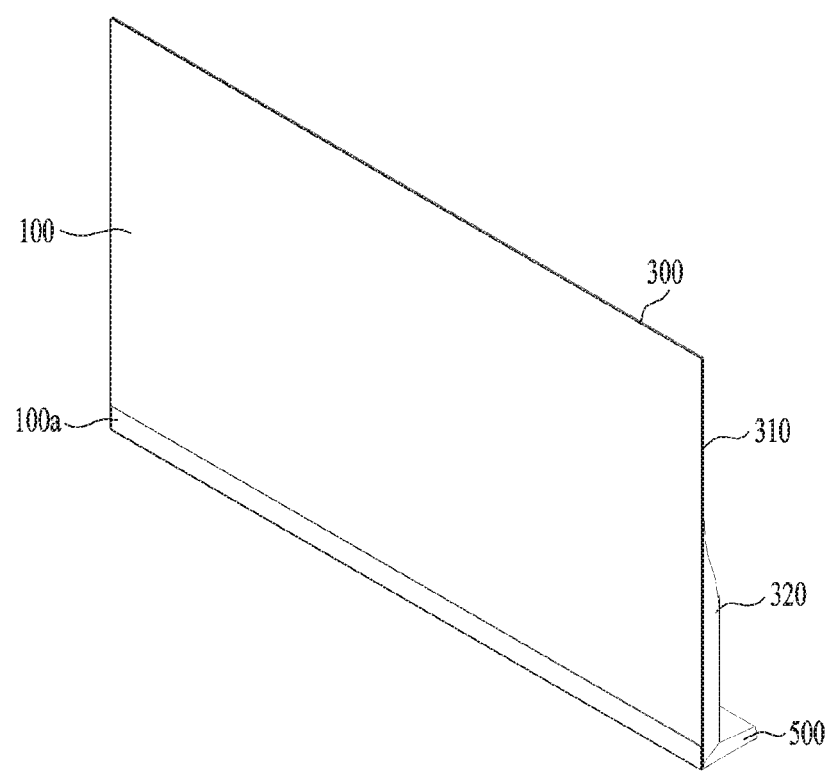
FIG. 1 is a perspective view of a display device according to the present disclosure.

Hereinafter, a device for cleaning a surface and a controlling method thereof according to the present disclosure will be described in detail with reference to the accompanying drawings.

In the following description, the same or similar elements are denoted by the same reference numerals even though they are depicted in different drawings and redundant descriptions thereof will be omitted. With respect to elements used in the following description, the suffixes "module" and "unit" are used or combined with each other only in consideration of ease in the preparation of the description, and do not have or serve as different meanings. Accordingly, the suffixes "module" and "unit" may be interchanged with each other. In addition, in the following description, a detailed description for known functions and configurations incorporated herein will be omitted when it may make the subject matter disclosed in the present disclosure rather unclear. In addition, the accompanying drawings are provided only for a better understanding of the examples in the present disclosure and are not intended to limit the technical concept in the present disclosure. Therefore, it should be understood that the accompanying drawings include all modifications, equivalents and substitutions included in the scope and sprit of the present disclosure.

It will be understood that although the terms "first," "second," etc., may be used herein to describe various components, these components should not be limited by these terms. These terms are only used to distinguish one component from another component.

It will be understood that when a component is referred to as being "connected to" or "coupled to" another component, it may be directly connected to or coupled to another component or intervening components may be present. In contrast, when a component is referred to as being "directly connected to" or "directly coupled to" another component, there are no intervening components present.

As used herein, the singular form is intended to include the plural forms as well, unless the context clearly indicates otherwise.

In the present disclosure, it will be further understood that the terms "comprises", "includes," etc. specify the presence of stated features, numbers, steps, operations, elements, components, or combinations thereof, but do not preclude the presence or addition of one or more other features, numbers, steps, operations, elements, components, or combinations thereof. Further, for the same reasons, the present disclosure also covers any sub-combination excluding some features, integers, steps, operations, elements, or components from any predefined combination.

The embodiments to be described in the present specification relate to a flat-panel display device. However, it will be appreciated by those skilled in the art that the principles and configurations of the embodiments are equally applicable to other display devices.

Figure 2:
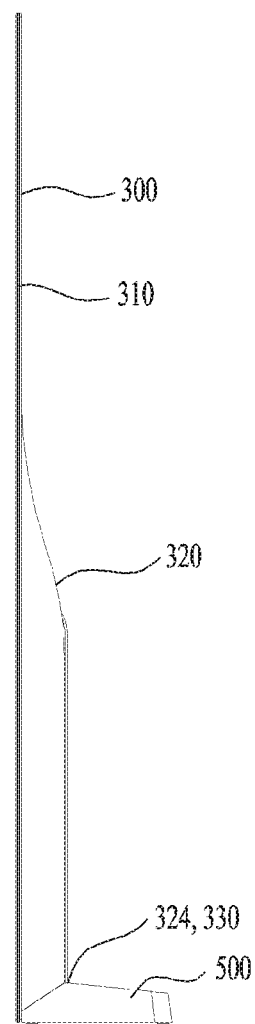
FIG. 2 is a side view of the display device of FIG. 1.
Figure 3:
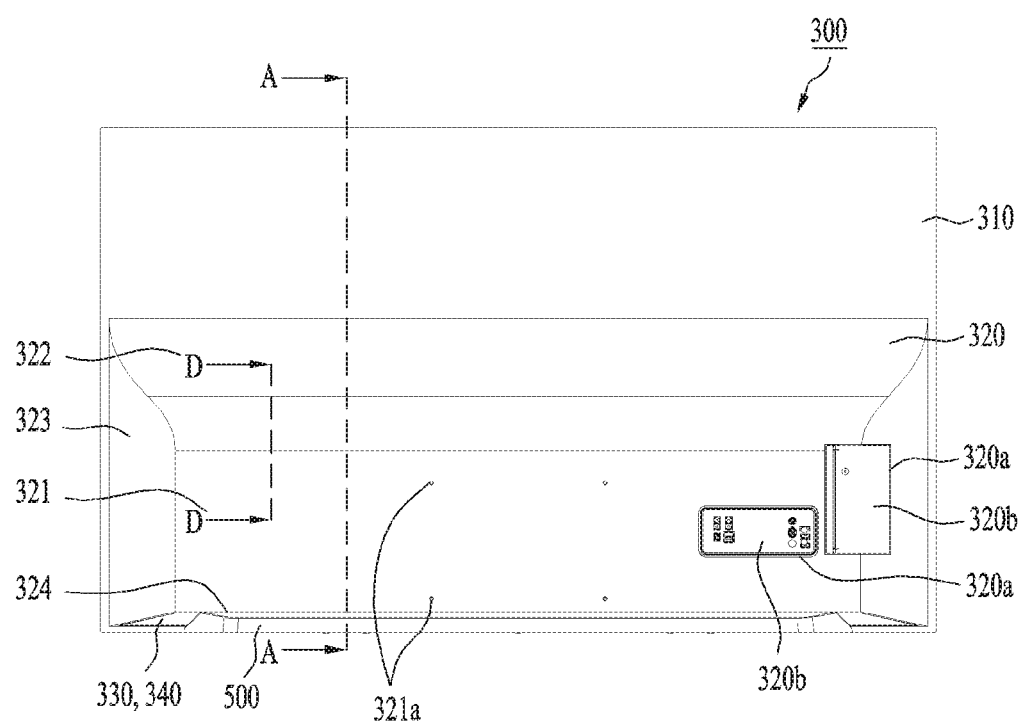
FIG. 3 is a rear view of the display device of FIG. 1.
Figure 4:
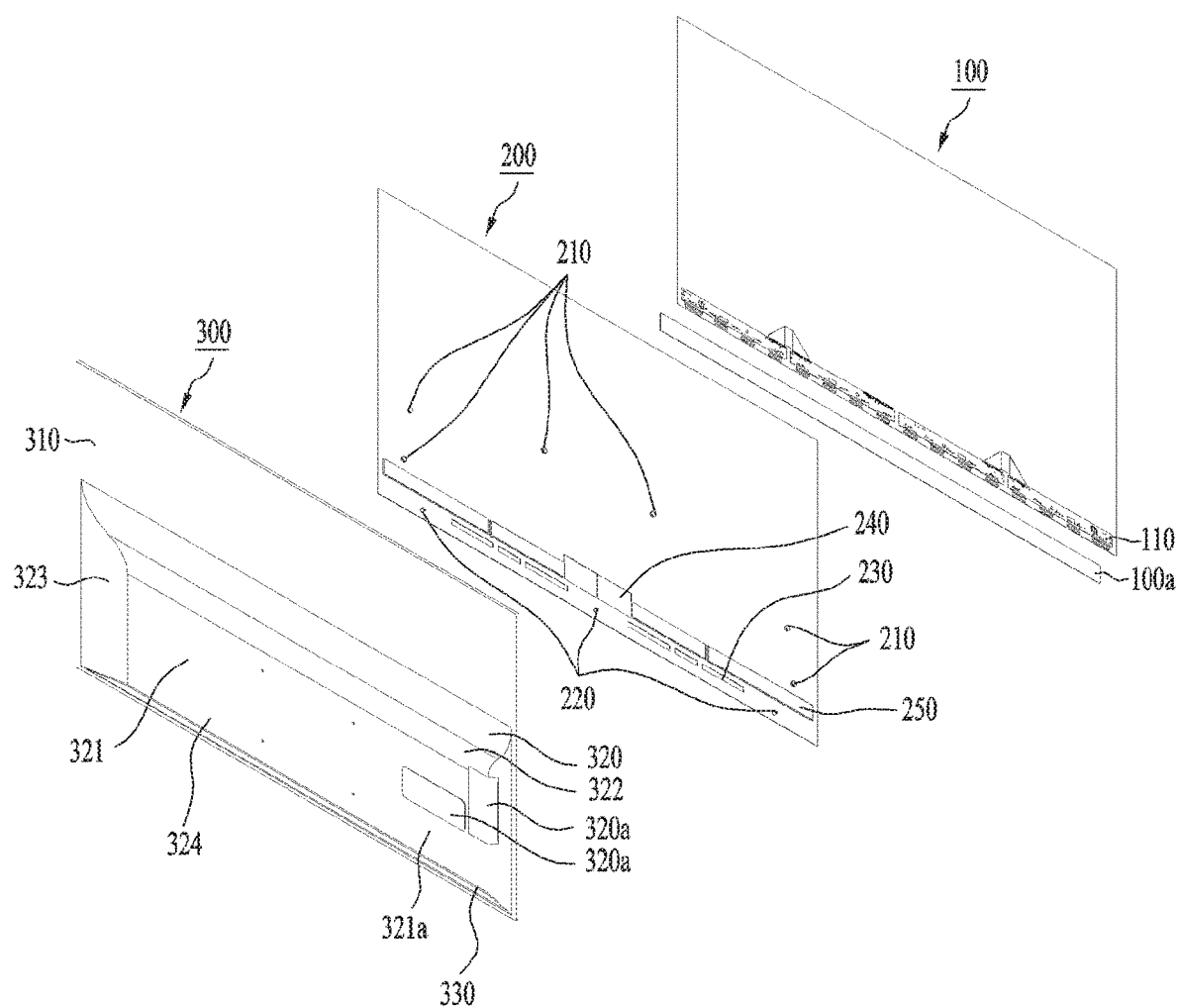
FIG. 4 is an exploded perspective view illustrating a preliminary assembly of the display device, which consists of a panel, an inner plate, and a rear cover.
Figure 5:
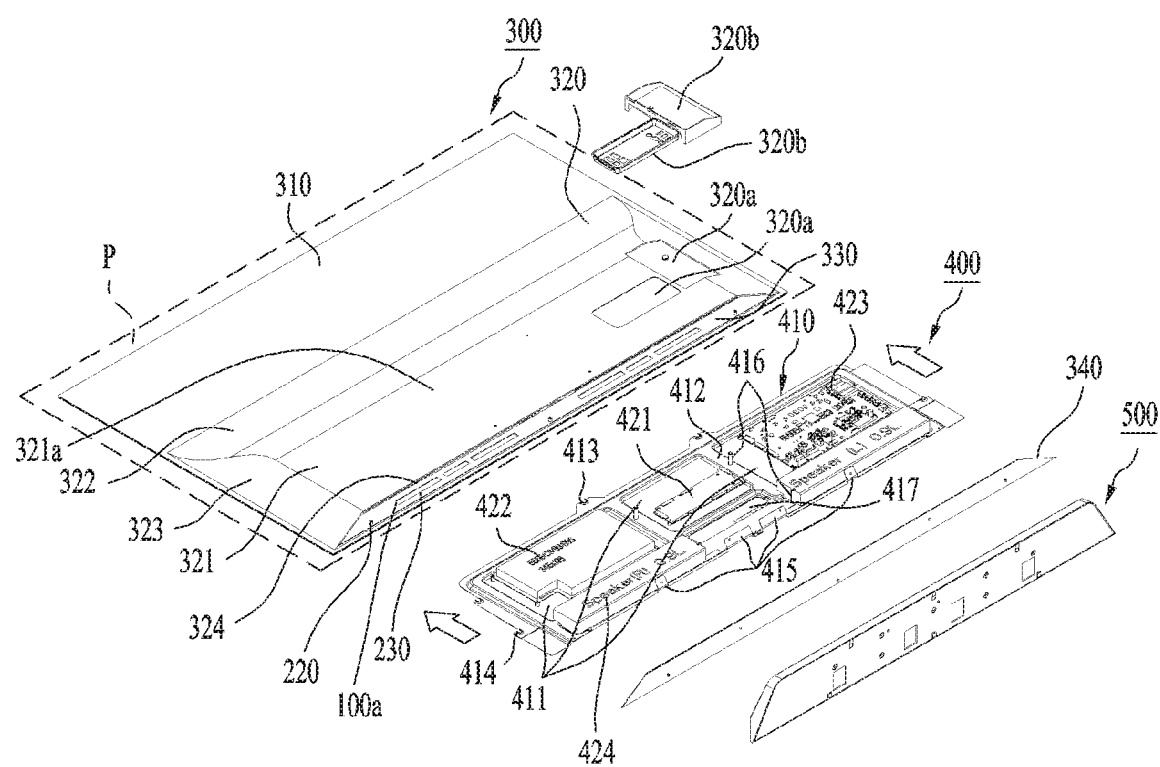
FIG. 5 is an exploded perspective view illustrating the preliminary assembly of FIG. 4 and a component module and a stand, which are coupled thereto.
Figure 6:
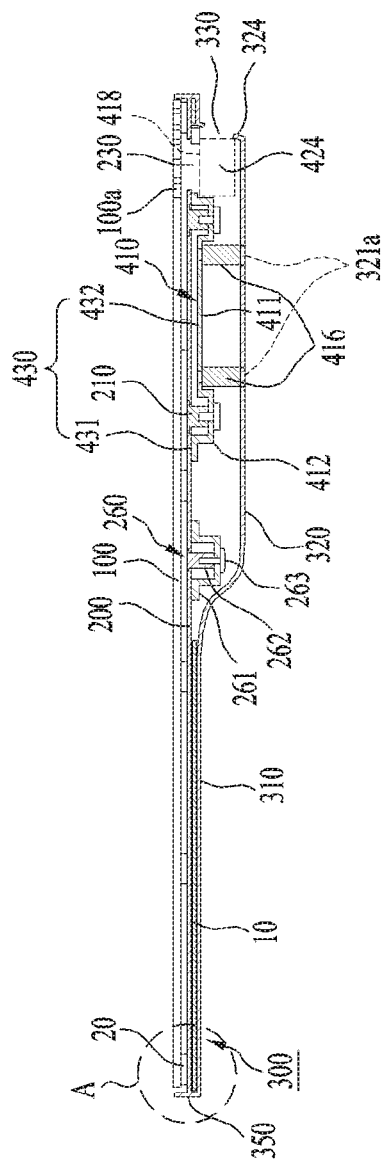
FIG. 6 is a cross-sectional view of the display device taken along the line A-A of FIG. 3.
Figure 7:
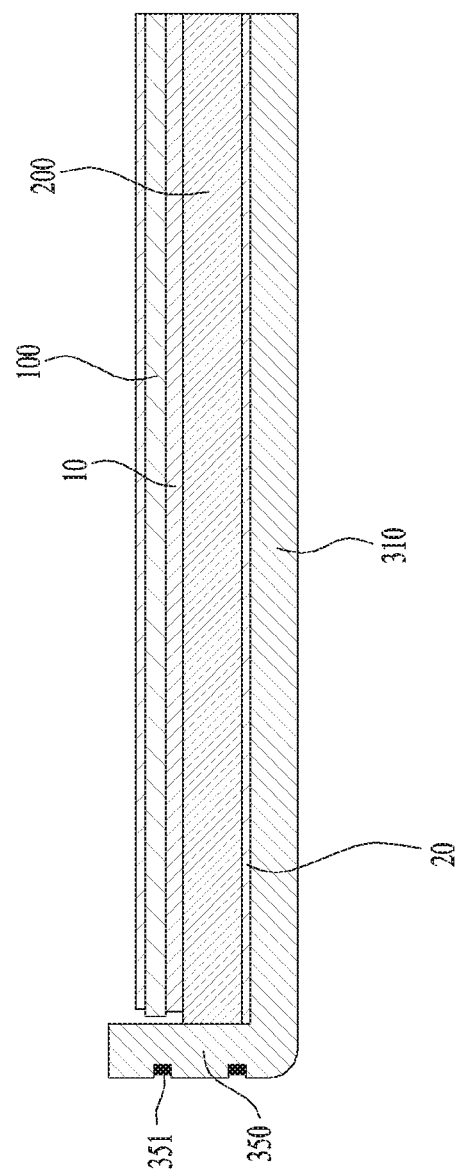
FIG. 7 is a partially enlarged view of the region A of FIG. 6.

FIGS. 1 to 3 are perspective, side, and rear views of a display device according to the present disclosure, respectively. FIG. 4 is an exploded perspective view illustrating a preliminary assembly of the display device, which consists of a panel, an inner plate, and a rear cover, and FIG. 5 is an exploded perspective view illustrating the preliminary assembly of FIG. 4 and a component module and a stand, which are coupled thereto. In addition, FIG. 6 is a cross-sectional view of the display device taken along the line A-A of FIG. 3, and FIG. 7 is a partially enlarged view of the region A of FIG. 6.

Referring to FIGS. 1 to 3, the display device according to the present disclosure may include a display panel 100. The display panel 100 is a component for creating an image on the display device and may have various configurations according to image creation principles. With the development of the corresponding technology, the display panel 100 has small thickness in general and may be configured to be flat as shown in the drawings. That is, the display panel 100 may be a flat panel. In addition, if necessary, the display panel 100 may be configured to have a predetermined curvature, and in this case, the display panel 100 may be a curved panel.

Recently, the display panel 100 has been implemented, for example, with a Liquid-Crystal Display (LCD) or an Organic Light Emitting Diode (OLED). The thickness and weight of the OLED are smaller than those of the LDC of the same size. In addition, the OLED has the property that its structural change can be easily achieved, but in the case of the LCD, it is difficult to achieve the structural change due to application of a light guide panel and other structural reasons. For these reasons, the display panel 100, and more in particular, the curved panel of the display device of the present disclosure can be implemented with the OLED. However, considering the above-described structural advantages, for example, easy deformation, light weight, small thickness, etc., other types of panels may be applied. If necessary, other types of panels including the LCD may be applied without consideration of the above-described advantages. For example, the display panel 100 may be implemented with a Plasma Display Panel (PDP), Field Emission Display (FED), and the like.

Specifically, the display panel 100 may include a secondary board 110 configured to receive a signal for driving the display panel 100 as shown in FIG. 4. More specifically, the secondary board 110 may be configured to receive a driving signal from a control board 421 (see FIG. 5) of a component module 400, which will be described later. The secondary board 110 may convert the driving signal provided by control board 421 into a signal suitable for image creation. To this end, the secondary board 110 may be connected to the control board 421 through a cable basically inside the device in order to receive the driving signal, i.e., video signal (source signal) from the control board 421. The secondary board 110 may convert a digital video signal, which is distributedly transmitted by the control board 421, into an analog video signal and transmit the converted analog video signal to each pixel of the display panel 100. To this end, the secondary board 110 may be directly connected to the display panel 100. Specifically, the secondary board 110 may be connected to each pixel of the display panel 100 using a connector (not shown in the drawings). The connector may include a flexible body and a plurality of circuits, which are included in the body and respectively connected to the pixels of the display panel 100. The secondary board 110 may include a source driver circuit for controlling and covering the digital video signal, i.e., source signal, and the driver circuit may include a processor and relevant electrical/electronic components. The driver circuit may be mounted on a Printed Circuit Board (PCB) with a predetermined size as shown in FIG. 4. In other words, the secondary board 110 may be composed of the PCB with the predetermined size and the source driver circuit mounted on the PCB. In addition, the secondary board 110 may be extended and arranged along a specific direction of the display panel 100, for example, the length direction of the display panel 100 as shown in the drawings to connect to the pixels of the display panel 100. The secondary board 110 may be referred to as a source board or a source PCB in terms of the functionality thereof.

In addition, as shown in FIGS. 1 to 4, the display device may include a cover 100a disposed in a lower portion of the display panel 100. As shown in FIG. 5, a speaker 424 of the component module 400 may be configured to be exposed outside the display panel 100 in order to output sound. The cover 100a may allow the output sound to pass through the cover 100a but hide (or cover) the exposed speaker 424 such that a user cannot see it. Thus, the cover 100a may be referred to as a decoration member or a grill. Specifically, the cover 100a may be in contact with the lower portion of the display panel 100 and disposed on the same plane as the display panel 100. Moreover, the cover 100a may be disposed such that it does not protrude from the front surface of the display panel 100. Thus, the cover 100a and display panel 100 may form one single plane on the front surface of the display device as shown in FIG. 1. Due to this arrangement, the cover 100a may improve the appearance of the display device while performing the intended functions. To perform the above-described functions, the cover 100a may form a front assembly of the display device together with the display panel 100.

The display panel 100 may be directly coupled to a rear cover 300, which will be described later. However, since the strength and stiffness of the display panel 100 are not high in general, it can be easily damaged by external forces. In addition, the display panel 100 may generate a large amount of heat while operating. The generated heat may be directly transferred to components of the component module 400 inside of the display device, and it may cause malfunction of the components. For these reasons, an inner plate 200 may be interposed between the display panel 100 and the rear cover 300. The inner plate 200 may be provided in a rear portion of the display panel 100, and more particularly, on a rear surface thereof as shown in FIGS. 4, 6, and 7. Specifically, the inner plate 200 is coupled to the rear portion of the display panel 100 and may be in direct contact with the rear portion. The inner plate 200 may include a thin body. As shown in the drawings, the inner plate 200 may cover the entire rear portion of the display panel 100. In addition, as described above, the inner plate 200 may also cover a rear portion of the cover 100a disposed in the lower portion of the display panel 100. In other words, an assembly of the display panel 100 and the cover 100a may be provided on and coupled to a front surface of the inner plate 200.

The inner plate 200 may be made of a material with high strength and stiffness. In addition, the inner plate 200 may be made of a material having not only the high strength and stiffness but high heat conductivity and heat capacity. For example, the inner plate 200 may be made of aluminum or aluminum alloy. Thus, the inner plate 200 may reinforce the strength and stiffness of the display panel 100, and therefore prevent the display panel 100 from being damaged. Moreover, the inner plate 200 may basically absorb most of the heat generated by the display panel 100 due to high heat capacity and release the absorbed heat outside the display device through the rear cover 300 based on high conductivity. Hence, the temperature of the display device may be substantially maintained at a low level, thereby preventing malfunction of inner components. Due to the high heat-release performance of the inner plate 200, it is not necessary to form an additional exhaust or heat dissipation structure, for example, an exhaust port for releasing heat in the display device, and more particularly, in the rear cover 300. That is, the application of the inner plate 200 may improve the appearance of the display device.

Specifically, the inner plate 200 may include a plurality of mounts 210 provided in the body thereof. The mounts 210 are members for installing the components for driving the display device, i.e., the component module 400 within the display device, and the structures thereof will be described later in detail. As shown in the drawings, the mounts 210 may be installed on a rear surface of the inner plate 200 and not protrude from the front surface thereof. Therefore, the front surface of the inner plate 200 may be in uniform contact with the display panel 100 with no gap therebetween, and the thickness of the display device may decrease. In addition, a plurality of fastening holes 220 may be formed in the body of the inner plate 200. Similar to the mounts 210, the fastening holes 220 may be used to install the component module 400. Moreover, a first opening 230 may be formed in the body of the inner plate 200. The first opening 230 may be provided in a lower portion of the inner plate 200 such that it faces the cover 100a disposed in front of the inner plate 200. And, the first opening 230 may be provided such that it faces the speaker 424 disposed in rear of the inner plate 200 as shown in FIGS. 5 and 6. Thus, the sound generated by the speaker 424 may be smoothly output outside the display device through the first opening 230 and cover 100a. Further, the inner plate 200 may include a second opening 240 formed in the body thereof. The second opening 240 may allow a cable connected to the secondary board 110 disposed in front of the inner plate 200 to pass through the second opening 240 so that it can be connected to the control board 421 disposed in rear of the inner plate 200. Furthermore, the inner plate 200 may include a recess 250. The recess 250 may be formed such that there is an entrance in front of the inner plate 200 and it faces the secondary board 110. Thus, the secondary board 110 disposed on the rear surface of the display panel 100 may be accommodated within the recess 250. For these reasons, there is no space formed between the inner plate 200 and the display panel 100, and thus it may result in the uniform contact between the inner plate 200 and the display panel 100 and reduce the thickness of the display device.

Referring to FIGS. 1 to 7, the display device may include the rear cover 300 configured to enclose or cover the display panel 100 and the inner plate 200, which are coupled to each other. The rear cover 300 may be provided in a rear portion of the display panel 100 and inner plate 200, and more particularly, on the rear surface thereof, and thus, the rear cover 300 may cover the rear portion or rear surface. Specifically, the rear cover 300 is coupled to the rear portion of the inner plate 200, which is coupled to the rear portion of the display panel 100 and may be in direct contact with the rear portion. In other words, the assembly of the display panel 100 (including the cover 100a) and the inner plate 200 may be provided on and coupled to a front surface of the rear cover 300.

The rear cover 300 may have a thin body similar to the inner plate 200, and more specifically, it may be composed of one continuous body, that is, a single piece body. Similar to the display panel 100, which is exposed as the front surface of the display device, the rear cover 300 may be an outermost element exposed as the back of the display device, and thus it may form rear and side appearances of the display device with no additional components. That is, the housing of the display device may be substantially formed by the single rear cover 300. Therefore, the overall appearance of the display device may be formed by the display panel 100 and the rear cover 300. In addition, as described above, the rear cover 300 may adhere to the inner plate 200, and the plate 200 may be attached to the panel 100 (the order may vary). This configuration can be seen from the side surface of the display device shown in FIG. 2 and the cross sections of FIGS. 6 and 7. For these reasons, the display device may have a simple structure where the entire structure is composed of only the panel 100, plate 200, and cover 300. Moreover, due to a small number of elements (100 to 300), the display device may be slim as shown in the drawings and thus have an improved appearance.

Additionally, similar to the inner plate 200, the rear cover 300 may be made of a material with high stiffness and strength to improve the structural strength of the display device. In addition, the rear cover 300 may be made of a material with high heat conductivity and heat capacity to enhance the heat dissipation performance of the display device. For example, the rear cover 300 may be made of aluminum or aluminum alloy similar to the inner plate 200. In this case, the rear cover 300 can improve the overall strength and stiffness of the display device and prevent the display panel 100 and other major components from being damaged by external forces. Moreover, the rear cover 300 may efficiently release heat generated by the display panel 100 and other inner components to the outside due to the high heat conductivity and heat capacity. Furthermore, additional surface processing may be applied to the rear cover 300. For example, anodizing may be performed on the surface of the rear cover 300. In this case, the rear cover 300 may have a sleek and polished surface, and thus the appearance of the display device can be improved.

Specifically, referring to FIGS. 3 to 5, the rear cover 300 may include a first cover 310 disposed in the rear portion of the inner plate 200 or on the rear surface thereof. As shown in the drawings, the first cover 310 may be disposed in an upper portion of the display device, that is, an upper portion of the rear cover 300. Thus, the first cover 310 may be configured to substantially cover upper portions of the inner plate 200 and display panel 100, which face the upper portion of the rear cover 300. In addition, the first cover 310 may be configured to be thin as shown in FIG. 2. Moreover, the first cover 310 may adhere to and be in direct contact with the upper portion of the display panel 100/inner plate 200. Thus, due to the first cover 310, the display device, and more particularly, the upper portion thereof may become thin as shown in FIG. 2.

In addition, the rear cover 300 may include a second cover 320 which is spaced apart from the rear portion or rear surface of the inner plate 200 by a predetermined distance. That is, the second cover 320 may be configured to protrude from the first cover 310 toward the back of the rear cover 300. As shown in the drawings, the second cover 320 may be disposed in a lower portion of the display device, that is, in a lower portion of the rear cover 300. Thus, the second cover 320 may be configured to substantially cover lower portions of the inner plate 200 and display panel 100, which face the lower portion of the rear cover 300. However, unlike the first cover 310, since the second cover 320 is spaced apart from the rear portion of the inner plate 200, the second cover 320 and inner plate 200 may create a space for accommodating components. The first and second covers 310 and 320 may be formed as an integral part as shown in the drawings. In other words, the second cover 320 may be implemented such that it is continuous with the first cover 310 and cannot be detached therefrom. As shown in the drawings, the second cover 320 may include a rear portion 321, a top portion 322, which is connected to the rear portion 321, a side portion(s) 323, and a bottom portion 324, and these portions 321 to 324 are all formed to be continuous with the rear cover 300 (i.e., the first cover 310). In other words, since the first and second covers 310 and 320 are formed as an integral part, the rear cover 300 may have have a single piece body. If the first and second covers 310 and 320 are separately manufactured and then coupled to each other using a fastening member, it may not only increase the number of manufacturing processes but degrade the appearance. For these reasons, the first and second unified covers 310 and 320, that is, the single piece rear cover 300 may not only simplify the manufacturing process and structure of the display device but also provide a continuous and seamless appearance. As described above, since the first and second covers 310 and 320 are unified and then form the single piece rear cover 300, the first and second covers 310 and 320 could be interpreted as first and second portions or sections, respectively.

Moreover, the rear cover 300 may include a flange 350 extended from an edge thereof as shown in FIGS. 6 and 7. The flange 350 may be extended from an edge of the body of the rear cover 300, that is, a side portion thereof toward the front. The flange 350 may be configured to cover and protect side portions of the display panel 100 and inner plate 200. As shown in the drawings, a groove 351 may be formed and extended along the length direction of the flange 350. The groove 351 may improve the strength and stiffness of the flange 350. In addition, the groove 351 is filled with a decoration member or a paint, and thus the appearance of the display device can be improved. The flange 350 may be provided in all or some of the side portions of the rear cover 300.

Other components of the display device, for example, electronic or electrical components and circuits may be installed in any one of the above-described elements 100 to 300 in advance. For example, components may be installed in the inner plate 200 in advance before assembling the elements 100 to 300. However, since the components are sensitive and vulnerable and may be exposed without protection from the inner plate 200 until the elements 100 to 300 are completely assembled, the installed components may be damaged or broken while the inner plate 200 is coupled to the display panel 100 and the rear cover 300. For these reasons, by assembling the display panel 100, inner plate 200, and rear cover 300, which are relatively large elements, in advance as shown in FIG. 3, it is possible to form a preliminary assembly P and then install the components within the assembly P as shown in FIG. 4. Specifically, referring to FIGS. 3, 6, and 7, when the assembly P is manufactured, the inner plate 200 may be first coupled to the front surface of the rear cover 300. Although multiple coupling mechanisms may be applied for the coupling, an adhesive member 10 may be applied to the display device of the present disclosure. Since the adhesive member 10 is directly applied between two components to be coupled, it does not require a large space compared to a normal fastening member. For example, a thermosetting adhesive or a double-sided adhesive tape may be used as the adhesive member 10. The adhesive member 10 may be applied to a front surface of the first cover 310 in direct contact with the inner plate 200, that is, to the inside thereof rather than the spaced-out second cover 320 as shown in the drawings. When the adhesive member 10 is applied, the inner plate 200 can be strongly coupled to the rear cover 300. Thereafter, the display panel 100 may be coupled to the front surface of the inner plate 200. Although many coupling mechanisms may be applied for this coupling, an adhesive member 20 may be used for the same reason. However, since the display panel 100 is vulnerable to heat, the adhesive member 20 may be a double-side adhesive tape except a thermosetting adhesive. The adhesive member 20 may be applied to the front surface of the inner plate 200 as shown in the drawings so that the display panel 100 can be strongly coupled to the inner plate 200. The cover 100a may adhere to the inner plate 200 in the same way as the display panel 100 such that the cover 100a is on the same plane as the display panel 100.

The display panel 100, inner plate 200, and rear cover 300 may form the single preliminary assembly P through the coupling. When the inner plate 200 adheres to the rear cover 300 as described above, the inner plate 200 and the second cover 320, which is spaced apart from the inner plate 200, may form a space for accommodating components in the rear portion of the display panel 100 (or the display device) as shown in the drawings. Specifically, a part of the inner plate 200, which faces the second cover 320, acts as a platform where components can be installed, and the second cover 320 acts as a cover for protecting the components installed in the inner plate 200. In addition, since only the thin adhesive members 10 and 20 are interposed, the upper portion of the display device composed of the display panel 100, inner plate 200, and rear cover 300, and especially, first cover 310 may have a thin body. Thus, the display device may have the lower portion (i.e., second cover 320) protruding minimally to accommodate the components and the maximally thinned upper portion (i.e., first cover 310). By doing so, the display device may have not only the simple structure but the slim and compact appearance.

Specifically, in order to couple the inner plate 200 and components together, a coupling mechanism needs to be disposed within the (accommodation) space formed by the inner plate 200 and second cover 320. Thus, the mounts 210 may be installed on the inner plate 200 such that they are located in the space. For the same reason, the fastening holes 220 may be formed on the inner plate 200 such that they are located in the space. In addition, as shown in FIG. 6, a reinforcement part 260 may be additionally provided on the inner plate 200 to improve the strength and stiffness of the display panel 100. Since the reinforcement part 260 requires an installation space, it may be installed together with the components in the space to avoid an increase in the volume of the display device. For example, the reinforcement part 260 may be a bar member 261. The bar member 261 may have a channel shape so that it has proper strength and stiffness with no weight increase. The bar member 261 can be strongly coupled to a mount 262 installed on the inner plate 200 through a fastening member 263, thereby improving the strength and stiffness of the display panel 100.

Since the display panel 100, inner plate 200, and rear cover 300 are preassembled as the preliminary assembly P as described above, components can be installed in the space through a part of the preliminary assembly P. Since the space is actually formed by the rear cover 300, and more particularly, by the second cover 320, the components may be inserted into the space through a part of the second cover 320. However, if the entrance of the space is formed in the rear, upper, or side portion 321, 322, or 323 of the second cover 320, the entrance may be exposed from the display device, and thus the appearance may be degraded. On the other hand, since the bottom portion 324 of the second cover 320 is covered by the floor where the display device is located, it may not be exposed to the outside. Therefore, the present disclosure proposes that the components are inserted into the space of the display device through the bottom portion 324 of the second cover 320. Specifically, as the entrance of the space, an opening 330 may be formed in the bottom portion 324 of the second cover 320 as shown in FIGS. 4 to 6, and the components can be inserted into the space through the opening 330.

Figure 8:
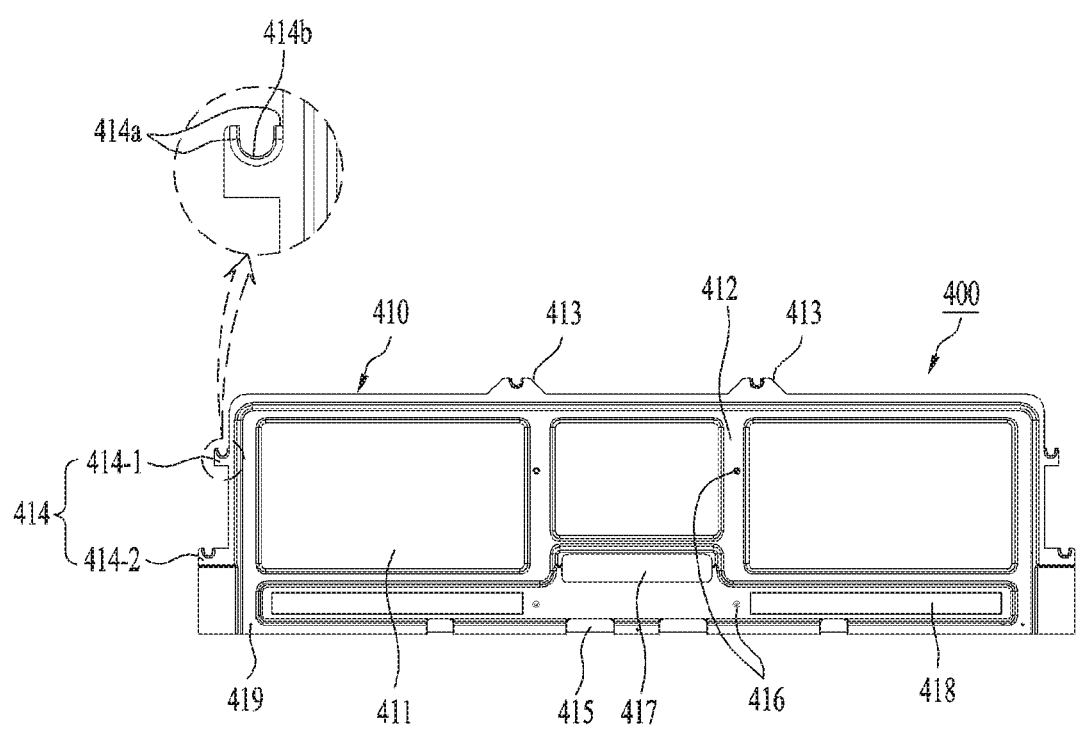
FIGS. 8 and 9 are plan views illustrating the component module of the display device.
Figure 9:
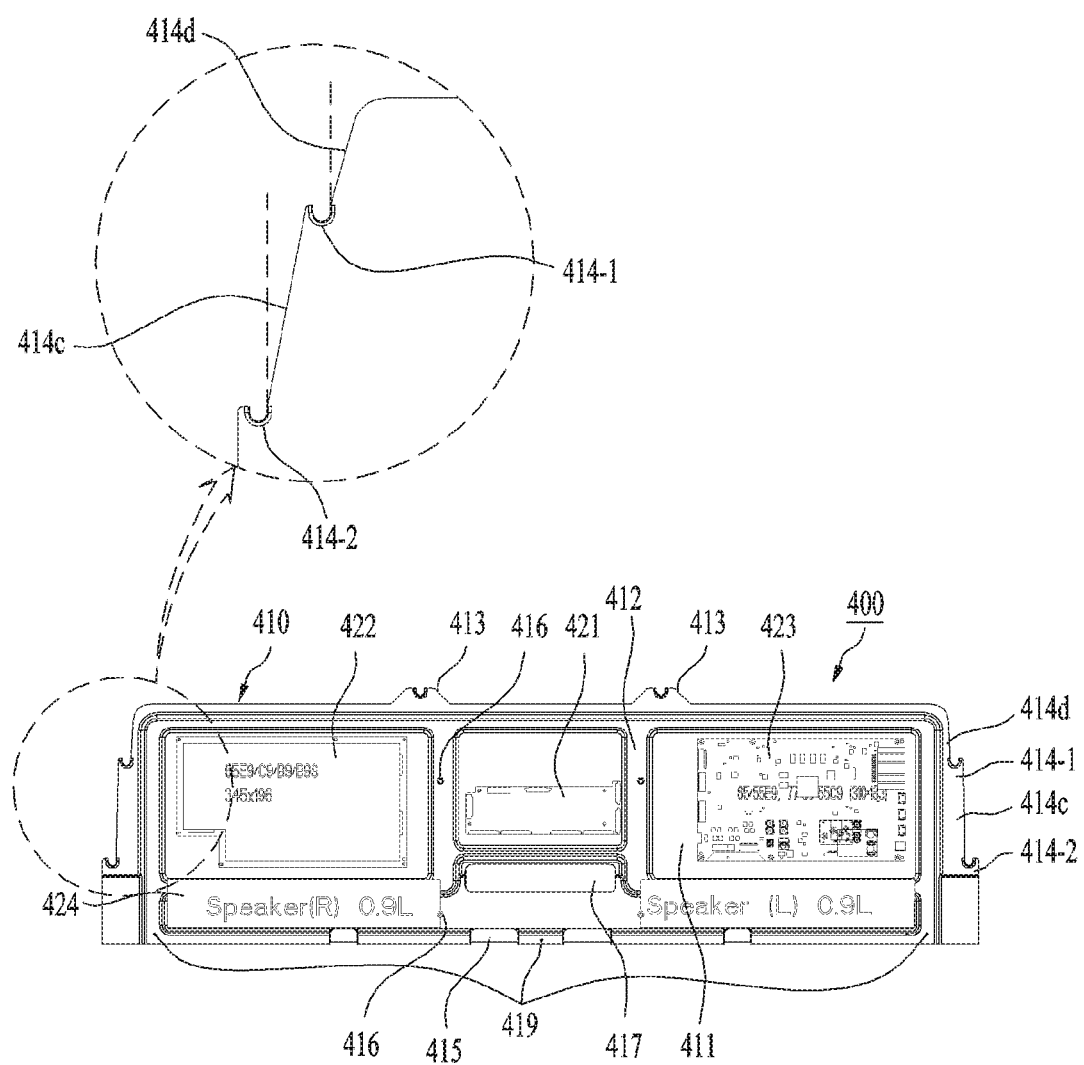
Figure 10A:
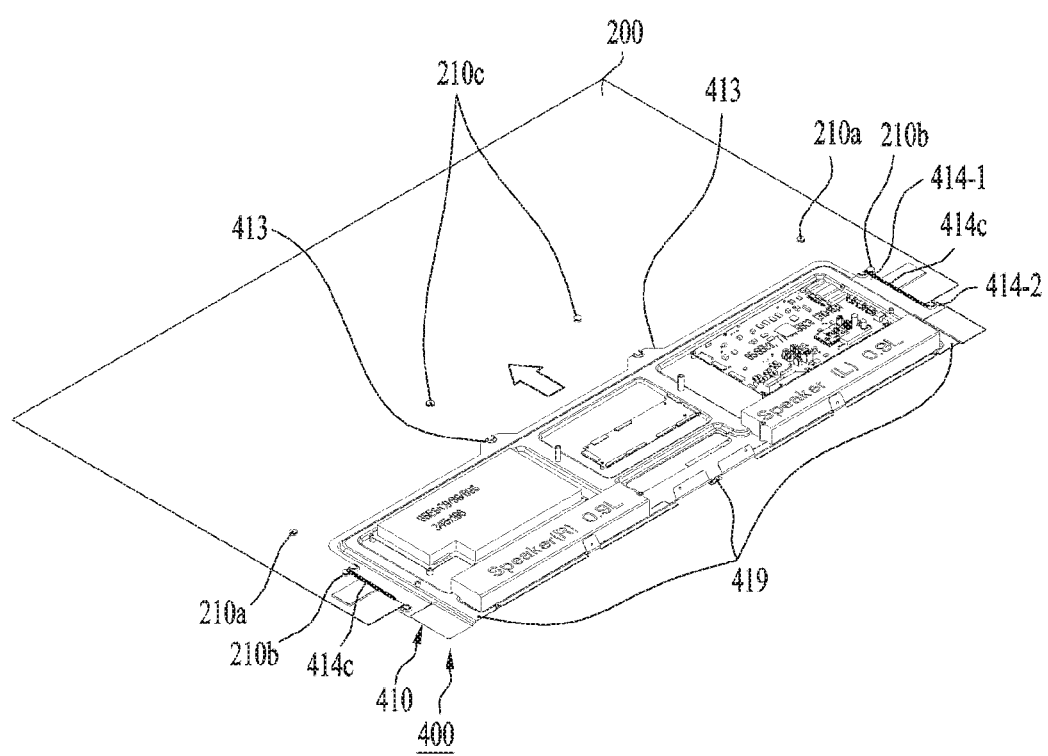
FIGS. 10A to 10C are perspective views illustrating a process for inserting the component module into the preliminary assembly of the display device.
Figure 10B:
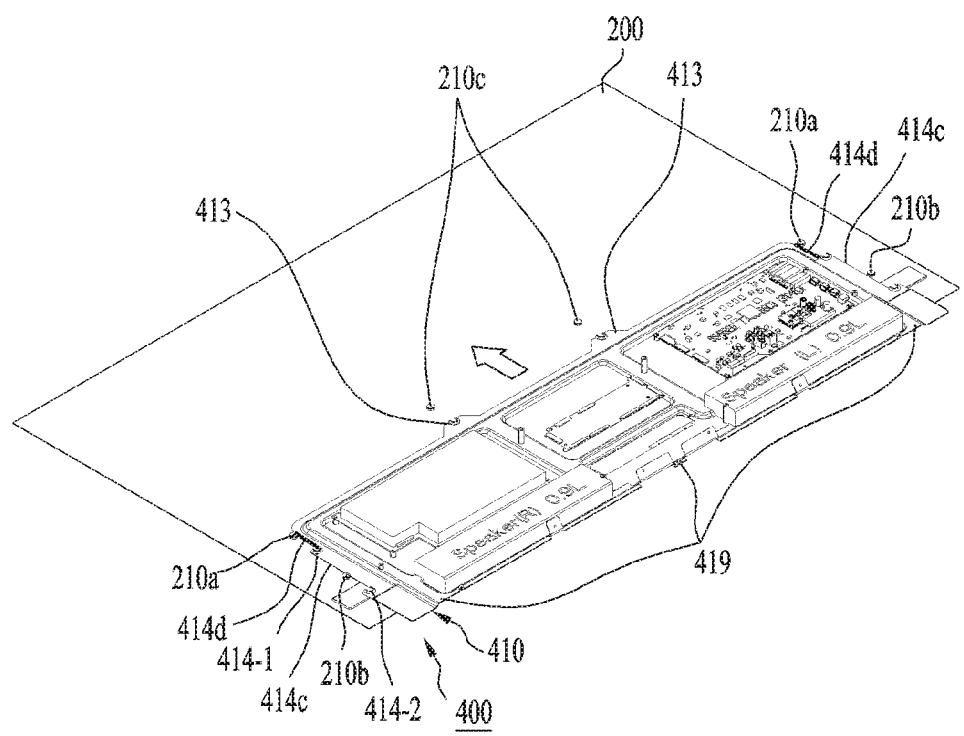
Figure 10C:
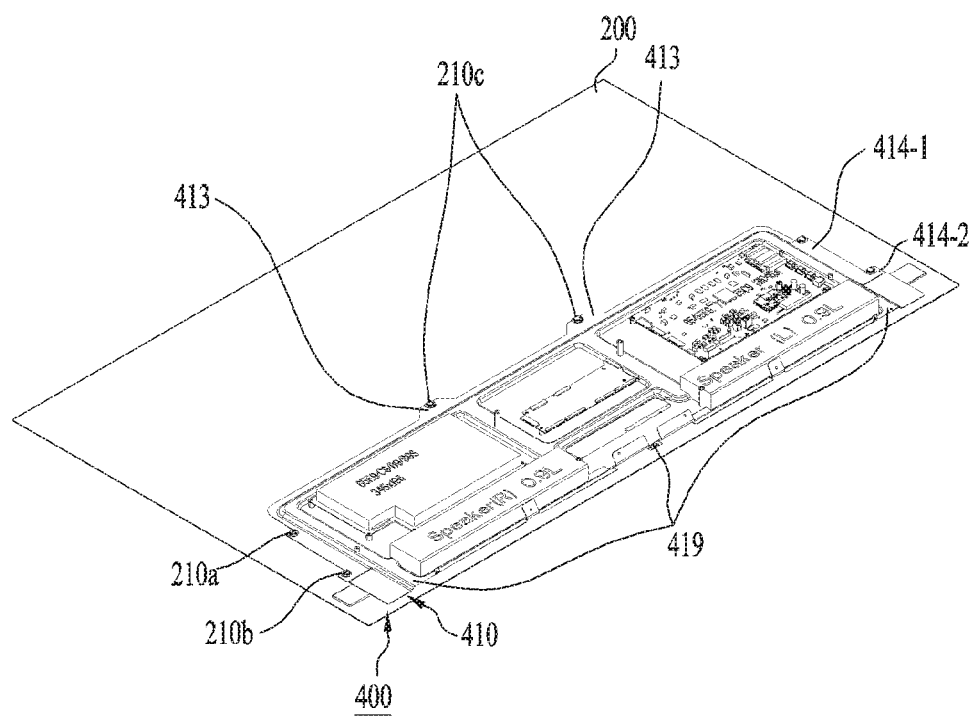
Figure 11:
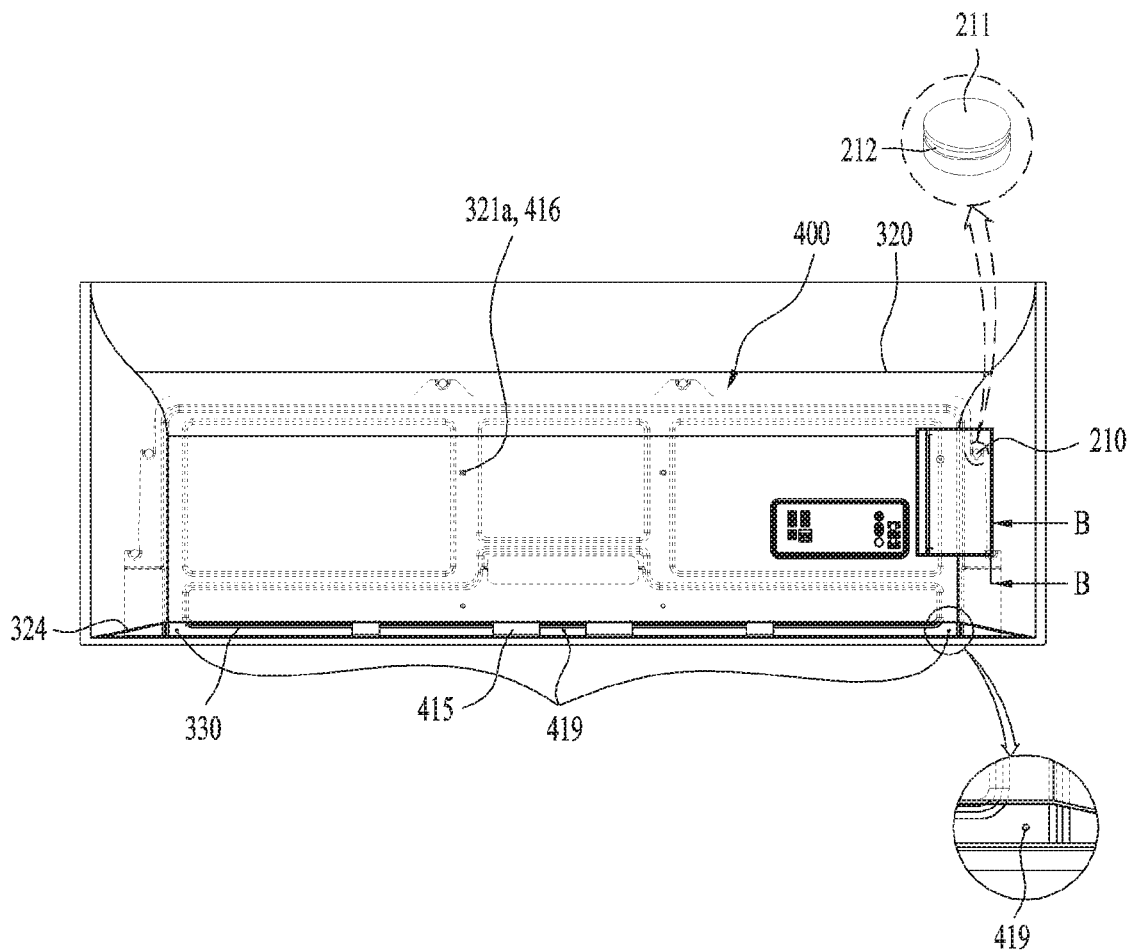
FIG. 11 is a plan view illustrating the component module inserted into the preliminary assembly of the display device.
Figure 12:
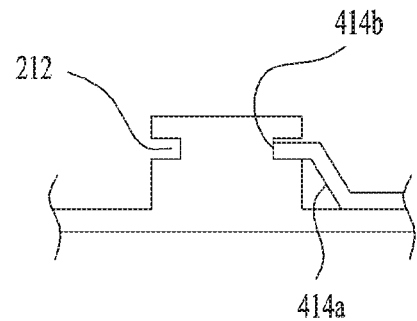
FIG. 12 is a cross-sectional view taken along the line B-B of FIG. 11.

In addition, considering that the size of the space formed by the preliminary assembly P needs to be minimized, the productivity may be significantly degraded if the components are individually installed in the space. Thus, for the display device according to the present disclosure, all the components may be manufactured as a single module, that is, the component module 400 and then simultaneously installed in the space. The component module 400 will be described in detail with reference to FIGS. 8 to 12 in addition to FIGS. 5 and 6. FIGS. 8 and 9 are plan views illustrating the component module of the display device, FIGS. 10A to 10C are perspective views illustrating a process for inserting the component module into the preliminary assembly of the display device, FIG. 11 is a plan view illustrating the component module inserted into the preliminary assembly of the display device, and FIG. 12 is a cross-sectional view taken along the line B-B of FIG. 11.

Referring to FIGS. 5 and 6, the component module 400 may include a bracket 410. The bracket 410 may include a plate member with a predetermined size and have small thickness. In addition, the component module 400 may include a plurality of components 421, 422, 423, and 424 installed on the bracket 410. Thus, the component module 400 may combine the plurality of components 421 to 424 as a single module or device using the bracket 410. The component module 400 may be inserted into the space through the bottom portion of the second cover 320 (that is, the bottom portion of the display device), and more particularly, through the opening 330 formed in the bottom portion of the second cover 320 toward the top of the display device as shown in FIG. 5. By inserting the component module 400, the plurality of components 421 to 424 can be simultaneously installed in the display device, thereby improving the productivity. However, since the size of the space is minimized as described above, the component module 400 may be damaged if it collides with the second cover 320 when inserted into the space. Thus, the component module 400 may slide on the inner plate 200 to be inserted from the bottom portion of the display device to the upper portion thereof through the opening 330. During this sliding motion, the component module 400 may be supported by the inner plate 200 and maintain an appropriate distance with the second cover 320, and thus, the component module 400 can be stably disposed within the space without interference from the second cover 320.

Specifically, the bracket 410 may include a recess 411 formed in a body thereof and configured to accommodate the components 421 to 424. If the components 421 to 424 are accommodated in the recess 411, the components 421 to 424 do not significantly protrude from the bracket 410, and thus the overall thickness or height of the component module 400 may be reduced. Therefore, the recess 411 is not only advantageous in accommodating the component module 400 in the space with a limited size but can make the display device slimmer by reducing the size of the space. In addition, the component module 400 may include a partition wall 412 configured to isolate the components 421 to 424 from each other. As shown in the drawings, the partition wall 412 may be formed between recesses 411 and extended from the body of the bracket 410 such that it has a predetermined height. The components 421 to 424 may generate electromagnetic waves while operating, and the generated electromagnetic waves may disturb operation of other neighboring components. However, the partition wall 412 may somewhat cancel the generated electromagnetic waves, whereby the components 421 to 424 may normally operate without interference.

The component module 400 may include the control board 421 as a component, and the control board 421 may be disposed in a center portion of the bracket 410. The control board 421 may be configured to control a signal for driving the display panel 100, that is, a driving signal. Specifically, the control board 421 may control a digital video signal received from the outside, for example, a source signal and appropriately forward the received digital video signal to the secondary board 110 (see FIG. 4) in order to accurately create an image on the display panel 100. The control board 421 may include a control circuit configured to control a video signal, and the control circuit may be composed of a processor and relevant electronic/electrical components. The circuit and components may be mounted on a PCB with a predetermined size. Such a control board 421 may be commonly called a T-con board or a control PCB in the corresponding technical field. A first opening 417 with a predetermined size may be formed adjacent to the control board 421 in the body of the bracket 410. When the component module 400 is inserted into the space, the first opening 417 may be connected to the second opening 240. As described above, the secondary board 110 may be connected to the control board 421 through the cable penetrating the first opening 417 and second opening 240, which are connected to each other, and thus, a driving signal can be transmitted from the control board 421 to the secondary board 110.

In addition, the component module 400 may include a power supply 422 as a component, and the power supply 422 may be disposed close to one side portion of the bracket 410. The power supply 422 may be configured to supply power required for driving the display device. As a component, a main board 423 may be disposed close to the other side portion of the bracket 410 such that it faces the power supply 422. The main board 423 may be configured to control overall operation of the display device and composed of various circuits and components installed on a circuit board with a predetermined size. Moreover, the main board 423 may include terminals for inputting and outputting audios and videos. The second cover 320 may include openings 320a corresponding to the terminals, and covers 320b may be inserted into the openings 320a. The covers 320b covers the main board 423 but may expose the terminals to the outside. By doing so, external audio and video cables may be connected to the terminals. As a component, the speaker 424 may be disposed in a lower portion of the bracket 410. As shown in FIG. 6, a second opening 418 may be formed in front of the speaker 424 in the body of the bracket 410. When the component module 400 is installed, the second opening 418 may be connected to the first opening 230 of the inner plate 200. Thus, sounds generated by the speaker 424 may be smoothly output outside the display device through the second opening 418, the first opening 230 and the cover 100a. Furthermore, multiple bosses 416 may be provided in the body of the bracket 410. The bosses may be extended from the body of the bracket 410 to the adjacent second cover 320, and more particularly, to the rear portion 321 of the second cover 320. And, they may include screw parts. The second cover 320 may include multiple penetration holes 321a corresponding to the ends of the bosses 416. When the component module 400 is disposed in the space, the bosses 416 and penetration holes 321a are aligned, and the screw parts in the bosses 416 may be connected to the penetration holes 321a as shown in FIG. 6. The bosses 416 and penetration holes 321a allow the display device to be attached to a wall through fastening members. These bosses 416 and penetration holes 321a may be called as a VESA mount.

Meanwhile, as described above, the size of the space is small, and the space is enclosed by the second cover 320. Thus, it may be difficult to install the component module 400 in the space using a tool and a fastening member. For this reason, the display device of the present disclosure can adopt a coupling mechanism for directly engaging the component module 400 with the inner plate 200. According to this coupling mechanism, the component module 400 can be strongly coupled to the inner plate 200 with no fastening member, thereby significantly improving the productivity in manufacturing the display device. Specifically, since the component module 400 is inserted through the lower portion of the second cover 320 as shown in FIG. 5, it may be more difficult to access upper and side portions of the component module 400 than a lower portion thereof. Therefore, the coupling mechanism may be applied first to the upper and side portions of the component module 400.

The coupling mechanism can be implemented in various ways. For example, the coupling mechanism may include coupling between the mounts 210 provided on the inner plate 200 and flaps or latches 413 and 414 provided in the component module 400 as shown in FIGS. 8 to 11. The flaps 413 and 414 may include a top flap 413 provided in the upper portion of the component module 400 and a side flap 414 provided in the side portion of the component module 400. These flaps 413 and 414 can be extended from the bracket 410 by a predetermined distance and in this case, they may be formed as a part of the bracket 410. In addition, the flaps 413 and 414 may directly engage with the mounts 210 with no fastening member to be coupled to the mounts 210. Specifically, the side flap 414 may be implemented as a clamp capable of elastically holding the mount 210 as shown in FIG. 8. The side flap 414 may include a pair of arms 414a, which are spaced apart from each other by a predetermined distance. Due to an open hole 414b, which is formed in a body of the side flap 414, these arms 414a may be considered as a part of the body of the side flap 414. In addition, the mount 210 may include a body 211 extended from the inner plate 200 toward the component module 400 as shown in FIG. 11. When the component module 400 is inserted into the space, the mount 210 may be in contact with the flap 414. Thereafter, when the mount 210 is inserted into the hole 414b, the arms 414a around the hole 414b may be transformed and then elastically engage with an outer circumference portion of the mount 210. Moreover, the mount 210 may further include a groove 212 formed in the outer circumference portion of the body 211 as shown in FIG. 11. In this case, the arms 414a of the side flap 414 can be inserted into the groove 211 instead of directly engaging with the outer circumference portion of the body 211 so that they can be strongly coupled to the mount 210. The above-described configuration of the side flap 414 and mount 210 can be equally applied to the top flap 413 and mount 210 that engages therewith shown in FIG. 8. Further, the same configuration of the side flap 414 and mount 210 can be applied to the flaps 413 and 414 and corresponding mounts 210 shown in FIG. 9.

Meanwhile, the component module 400 may slide on the inner plate 200 from the lower portion of the display device to the upper portion thereof to be inserted into the space as described above. In this case, if a plurality of side flaps 414 are applied for stronger coupling and arranged in a straight line parallel with the side portion of the component module 400, the plurality of side flaps 414 may not be matched with corresponding mounts 210 while the component module 400 slides on the inner plate 200. Therefore, when a plurality of side flaps 414-1 and 414-2 are applied, the side flap 414-2, which is located below the side flap 414-1, may be located further away from the side portion of the module 400 than the side flap 414-1 as shown in FIGS. 8 and 9. In other words, the flap 414-2, which is located behind the flap 414-1 with respect to the insertion direction of the component module 400, may be positioned further away from the side portion of the module 400 than the flap 414-1. More specifically, the component module 400 may include the first flap 414-1, which is disposed in the upper portion thereof, and the second flap 414-2, which is spaced apart from the first flap 414-1 by a predetermined distance and disposed below the first flap 414-1. In addition, the second flap 414-2 may be extended and disposed further away from the side portion of the component module 400, and more particularly, from the side portion of the bracket 410 than the first flap 414-1. Moreover, as shown in FIGS. 10 and 11, first and second mounts 210a and 210b respectively coupled to the first and second flaps 414-1 and 414-2 may be disposed in a similar way as described above. That is, the second mount 210b may be disposed further away from the center line of the inner plate 200 than the first mount 210a. Due to the above-described configuration, the plurality of side flaps 414-1 and 414-2 can smoothly engage with the corresponding mounts 210a and 210b without interference while sliding on the inner plate 200 as shown in FIGS. 10A to 10C.

Additionally, the component module 400 may further include guides 414c and 414d configured to be in contact with the mounts and guide the sliding operation of the component module 400 when the component module 400 is inserted. These guides 414c and 414d may be provided in the side portion of the component module 400, and more particularly, in the side portion of the bracket 410 together with the flaps 414. The guides 414c and 414d may be substantially implemented as flanges extended from the side portion of the module 400 or bracket 410, and the ends of the flanges may be configured to be in contact with the mounts 210.

Specifically, as shown in FIG. 10A, when the component module 400 is inserted, an area between the first and second flaps 414-1 and 414-2 may first meet the second mount 210b, which is located below the first mount 210a. In consideration of the placement, the component module 400 may include a first guide 414c disposed between the first and second flaps 414-1 and 414-2 as shown in FIG. 9. In other words, the component module 400 may include the first guide 414c disposed above the second flap 414-2 or below the first flap 414-1. Alternatively, the component module 400 may include the first guide 414c disposed in front of the second flap 414-2 or in back of the first flap 414-1 with respect to the insertion or moving direction of the component module 400. The first guide 414c may be extended from the side portion of the bracket 410 and formed to connect the first and second flaps 414-1 and 414-2. Thus, the first guide 414c may guide the insertion of the component module 400 while continuously being in contact with the second mount 210b to be coupled to the second flap 414-2 between the first and second flaps 414-1 and 414-2 as shown in FIG. 10A.

Thereafter, when the insertion of the component module 400 proceeds further, a top area of the first flap 414-1 meets the first mount 210a, which is located above the second mount 210b, as shown in FIG. 10B. In consideration of the placement, the component module 400 may include a second guide 414d disposed above the first flap 414-1 as shown in FIG. 9. In other words, the component module 400 may include the second guide 414d disposed in front of the first flap 414-1 with respect to the insertion direction of the component module 400. The second guide 414d may be extended from the side portion of the bracket 410 and continuously formed until the first flap 414-1. Therefore, the second guide 414d may guide the insertion of the component module 400 while continuously being in contact with the first mount 210a to be coupled to the first flap 414-1 from the top of the side portion of the bracket 410 as shown in FIG. 10B. In addition, while the second guide 414d is in contact with the first mount 210a, the first guide 414c can be in contact with the second mount 210b at the same time, thereby stably guiding the insertion of the component module 400.

As shown in FIG. 10C, the first guide 414c may eventually guide the second mount 210b until the second flap 414-2 and the second guide 414d may eventually guide the first mount 210a until the first flap 414-1. Thus, the first and second flaps 414-1 and 414-2 may directly engage with the first and second mounts 210a and 210b, respectively, and at the same time, the top flap 413 may directly engage with a top mount 210c. Due to the direct engagement, the component module 400 can be strongly coupled to the inner plate 200 within the space.

Moreover, the first and second guides 414c and 414d may be oriented such that they are inclined toward the component module 400, and more particularly, toward the center axis or portion of the bracket 410 (that is, toward the inside of the bracket 410) as shown in FIG. 9. Due to the inclined orientation, a distance between the tops of the first guides 414c disposed in the both side portions of the bracket 410 may be shorter than that between the bottoms thereof. Thus, when the module 400 is inserted, the tops of the first guides 414c can be smoothly inserted between the second mounts 210b disposed on the both sides of the inner plate 200. For the same reason, that is, due to the inclined orientation, a distance between the tops of the second guides 414d disposed in the both side portions of the bracket 410 may be shorter than that between the bottoms thereof. Thus, when the module 400 is inserted, the tops of the second guides 414d can be smoothly inserted between the first mounts 210a disposed on the both sides of the inner plate 200.

Figure 13:
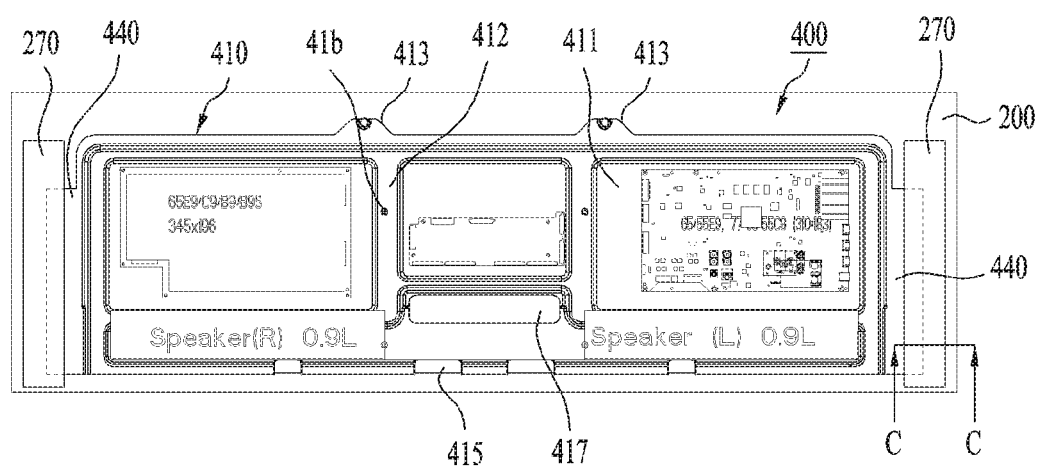
FIG. 13 is a plan view illustrating a modified coupling mechanism for the component module.
Figure 14:
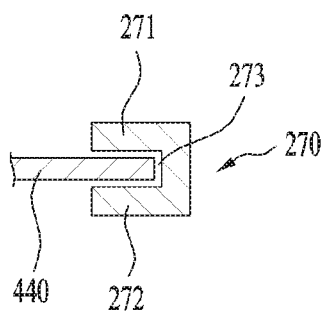
FIG. 14 is a cross-sectional view taken along the line C-C of FIG. 13.
Figure 15:
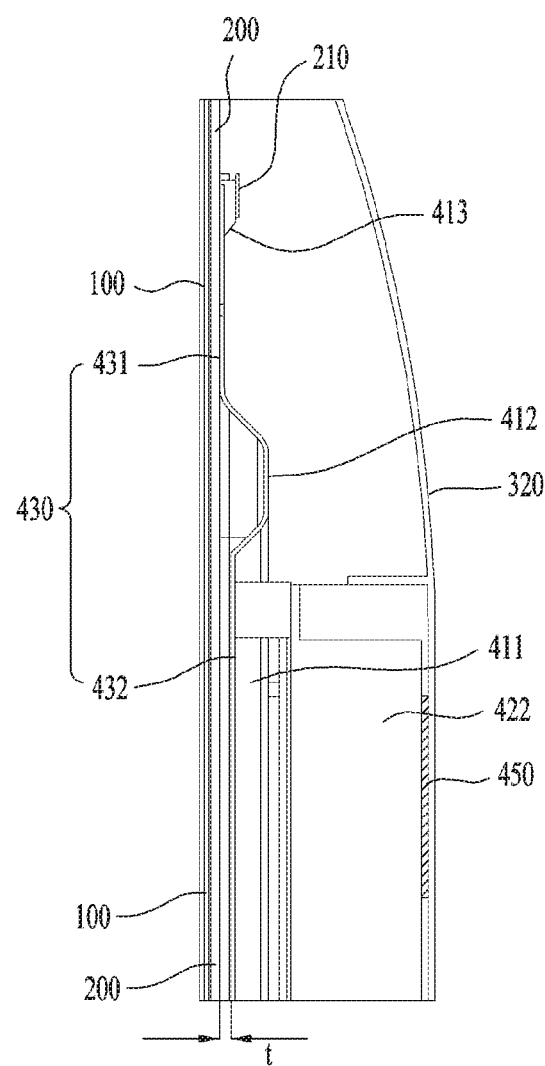
FIG. 15 is a cross-section view of the component module taken along the line D-D of FIG. 3.

Further, the display device of the present disclosure may adopt another coupling mechanism, which is different from the above-described mounts 210 and flaps 413 and 414, for the direct engagement between the component module 400 and inner plate 200. Such a modified coupling mechanism will be described in detail with reference to the related drawings. FIG. 13 is a plan view illustrating the modified coupling mechanism for the component module, and FIG. 14 is a cross-sectional view taken along the line C-C of FIG. 13.

Referring to FIG. 13, the inner plate 200 may include, as a coupling mechanism, a rail 270 provided in the body thereof, which is disposed adjacent to side portion of the component module 400, and more particularly, to the side portion of the bracket 410. In addition, the component module 400 may include, as a coupling mechanism, a flange 440 extended from the side portion of the component module 400. As shown in FIG. 14, the rail 270 may include an upper arm 271 and a lower arm 272, which is disposed below the upper arm 271. The upper and lower arms 271 and 272 may be spaced apart from each other by a predetermined distance, and thus a gap 273 may be formed therebetween. One end of the rail 270 adjacent to the component module 400 may be open, but the other end, which faces the one end, may be closed. In other words, the arms 271 and 272 may be connected to each other at the other end of the rail 270. When the component module 400 is inserted, the flange 440 may be configured to be forcedly fit within the gap 273. Thus, the flange 440 may be attached to and held by the arms 271 and 272. For these reasons, the flange 440 may directly engage with the rail 270 and thus be strongly coupled to the rail 270. These rail 270 and flange 440 may be equally applied to the upper portion of the component module 400.

Meanwhile, although the above-described coupling mechanism directly engages the component module 400 with the inner plate 200 so that the component module 400 and inner plate 200 can be strongly coupled to each other, additional fastening members may be applied for stronger coupling. Unlike the upper and side portions of the component module 400, the lower or bottom portion of the component module 400 can be easily accessed through the opening 330 formed in the lower portion of the second cover 320. Thus, as shown in FIGS. 9 and 11, the component module 400 may include multiple fastening holes 419 formed in the lower portion thereof, and more particularly, in the lower portion of the bracket 410 to couple to the inner plate 200. In addition, as shown in FIGS. 4 and 5, the inner plate 200 may include the fastening holes 220 corresponding to the above fastening holes 419. Considering that the fastening holes 419 of the bracket 410 are accessible after the component module 400 is completely inserted into the space, the coupling may be achieved using a tool. For this reason, the fastening holes 419 may be configured to be exposed from the rear cover 300, and more particularly, from the second cover 320 to the outside after the component module 400 is inserted into the space. Specifically, the lower portion 324 of the second cover 320 may be tilted upward as shown in FIG. 11 so that the fastening holes 419 are exposed. Due to the tilted lower portion 324, the fastening holes 419 of the component module 400 may be aligned with the fastening holes 220 of the inner plate 200 and then exposed to the outside. Eventually, the component module 400 can be coupled to the inner plate 200 more strongly by locking the fastening members into the fastening holes 419 and 220.

When the component module 400 is strongly coupled to the inner plate 200 using the coupling mechanism and fastening members as described above, the opening 330 may be closed by a bottom cover 340 as shown in FIG. 5. The rear cover 300 may include the bottom cover 340 to prevent foreign substances from entering into the space and protect the components of the component module. As shown in FIGS. 5 and 9, flanges 415, each has a fastening hole, may be formed in the lower portion of the component module 400, and more particularly, in the lower portion of the bracket 410. In addition, similar flanges may be formed in the lower portion of the second cover 320. The bottom cover 340 may be coupled by fastening the flanges with fastening members.

Figure 16:
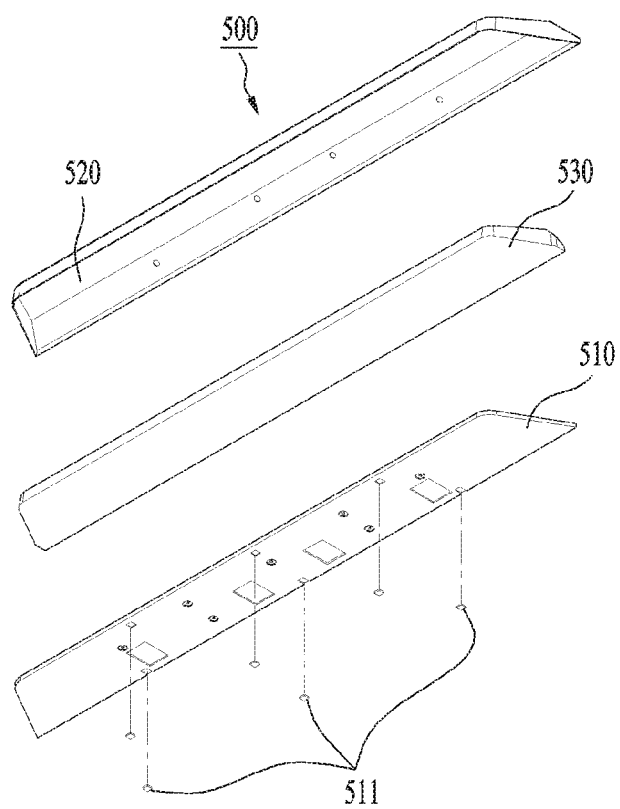
FIG. 16 is an exploded perspective view of the stand of the display device.

When the opening 330 is sealed by the bottom cover 340, a stand 500 may be provided in the lower portion of the second cover 320. The stand 500 may support the display device, and more specifically, an assembly of the panel 100, inner plate 200, rear cover 300, and component module 400 in standing on the floor. The stand 500 may be coupled to the bottom cover 340 using fastening members so that it can stably support the display device. Referring to FIG. 16, the stand 500 may include a bottom cover 510 and a top cover 520, which is coupled to the bottom cover 510. A pad 511 may be provided at a bottom of the bottom cover 510. And, the pad 511 may be made of a soft material having appropriate elasticity, for example, rubber. That is, the pad 511 may absorb the impact delivered to the display device from the floor and protect the display device from slipping on the floor by providing appropriate friction. In addition, a filler 530 may be disposed in a space formed between the top and bottom covers 520 and 510. The filler 530 may be made of a heavy material such as a casting, and thus the center of gravity of the display device may be positioned at the stand 500. Due to the stand 500, the display device can stably stand without falling down. Moreover, since the component module 400, which is relatively heavy, is disposed in the rear portion of the display device as described above, the overall center of gravity of the display device may be positioned in the rear portion thereof due to the component module 400 and stand 500. Hence, the stand 500 does need to be extended such that it protrudes from the front surface of the display device to prevent the display device from falling down forward. In other words, as shown in the side view of FIG. 2, the front end of the stand 500 may be positioned behind the front surface of the display device, and more particularly, behind the assembly of the display panel 100 and cover 100a. Therefore, the stand 500 is not exposed in front of the display device, thereby further improving the appearance of the display device.

Meanwhile, the component module 400 is disposed within the closed space and may generate a significant amount of heat while operating. Thus, it is important to efficiently control the heat generated by the component module 400 for normal operation of the display device. Specifically, referring to FIGS. 6 to 15, the bracket 410 of the component module 400 may include a surface 430 facing the inner plate 200. Since the surface 430 is in contact with the inner plate 200, heat generated by the components 421 to 422 may be delivered to the display panel 100 through the surface 430 and cause malfunction of the display panel 100. Therefore, the surface 430 may be spaced apart from the inner plate 200 by a predetermined gap t. Since the component module 400 should slide on the inner plate 200 for the insertion, at least part of the component module 400 needs to be in contact with the inner plate 200. Thus, the surface 430 may include a first surface 431 that is disposed on an edge thereof and in contact with the inner plate 200. Alternatively, the surface 430 may be disposed in most areas except edges and include a second surface 432 spaced apart from the inner plate 200 by the predetermined gap t. The above configuration can allow the component module 400 to slide on the inner plate 200 and at the same time minimize the contact with the inner plate 200. By doing so, it is possible to prevent the heat generated by the component module 400 from being delivered to the display panel 100, thereby preventing the malfunction of the display panel 100.

Moreover, the heat generated by the component module 400 needs to be released to the outside. Thus, the component module 400 may include a thermal pad 450 which is interposed between the components 421 to 424 and second cover 320 and delivers the heat generated by the components 421 to 424 to the second cover 320. The thermal pad 450 may be made of a material with high heat capacity and heat conductivity. In addition, the thermal pad 450 may be in contact not only with the components 421 to 424 but also with the second cover 320, and more particularly, with the inside thereof at the same time. The thermal pad 450 may absorb the heat from the components 421 to 424 and then deliver the absorbed heat to the second cover 320, and the second cover 320 may release the delivered heat to the outside of the display device. In other words, it is possible to efficiently release the heat generated by the component module 400 by applying the thermal pad 450, thereby preventing the malfunction of the components 421 to 424.

The display device according to the present disclosure has the following effects and advantages.

In the display device of the present disclosure, the display panel and the back cover made of a flexible and elastic material are formed as an integral part and configure the appearance of the display device without additional members.

Accordingly, the structure and appearance of the display device may become simple and slim. In addition, if the back cover is made of metal, the appearance of the display device can be further improved by appropriate surface processing.

Moreover, since the back cover is made of the flexible and elastic material, the display device is not vulnerable. In other words, the display device may have improved durability and reliability. Furthermore, it is easy to machine the back cover according to the present disclosure due to its elasticity and flexibility. Thus, it is possible not only to simplify the manufacturing process for the display device but to reduce a defect rate. For these reasons, the application of the back cover can improve the productivity of the display device and at the same time reduce decrease the unit cost of production.

It will be appreciated by persons skilled in the art that the effects of the present disclosure are not limited to what has been particularly described hereinabove and other advantages of the present disclosure will be more clearly understood from the following appended claims.

Although a number of representative examples are described above, it should be understood that numerous other modifications of these examples that fall within the spirit and scope of the principles of this disclosure can be devised by those skilled in the art. More particularly, various variations and modifications are possible within the scope of the disclosure, the drawings and the appended claims. In addition to variations and modifications, alternative uses will also be apparent to those skilled in the art.

What is claimed is:

1. A display device comprising:
a display panel;
an inner plate coupled to a rear portion of the display panel;
a rear cover configured to cover a rear portion of the inner plate, the rear cover including:
a first cover coupled to the rear portion of the inner plate; and
a second cover spaced apart from the rear portion of the inner plate to define a space within the display device; and
a component module including components configured to drive the display panel, wherein the component module is configured to be inserted into the space through a lower portion of the display device and engage with a mount disposed within the second cover,
wherein the first cover of the rear cover is configured to cover upper portions of the display panel and the inner plate; and
wherein the second cover of the rear cover is configured to cover lower portions of the display panel and the inner plate.

2. The display device of claim 1, wherein the mount is installed on the inner plate to be disposed within the space.

3. The display device of claim 1, wherein the first and second covers of the rear cover are formed as an integral part.

4. The display device of claim 1, wherein the second cover of the rear cover includes an opening formed at a bottom portion thereof and is configured such that the component module is inserted therethrough.

5. The display device of claim 4, wherein the rear cover further includes a bottom cover configured to selectively seal the opening.

6. The display device of claim 1, wherein the component module further includes a bracket including a plate member with a predetermined size, wherein the components installed on the bracket.

7. The display device of claim 6, wherein the bracket is shaped to include a recess configured to accommodate the components.

8. The display device of claim 6, wherein the bracket further includes a partition wall configured to isolate the components from each other.

9. The display device of claim 6, wherein the component module further includes a side flap provided at a side portion thereof and is configured to be coupled to the mount by engaging with the mount without a fastener.

10. The display device of claim 9, wherein the side flap includes a clamp configured to elastically hold the mount.

11. The display device of claim 10, wherein the mount includes a body extended toward the component module and a groove formed on an outer surface of the body where the clamp is inserted.

12. The display device of claim 6, wherein the component module further includes:
a first flap provided at a side portion of the component module; and
a second flap provided at the side portion and located below the first flap, wherein the second flap is disposed further away from the side portion than the first flap.

13. The display device of claim 12, wherein the component module further includes a guide configured to be in contact with the mount to guide a sliding motion of the component module when the component module is inserted into the space.

14. The display device of claim 13, wherein the guide includes a first guide disposed between the first and second flaps and configured to be in contact with a mount to be coupled to the second flap.

15. The display device of claim 14, wherein the guide further includes a second guide disposed above the first flap and configured to be in contact with a mount to be coupled to the first flap.

16. The display device of claim 1, wherein the component module further includes multiple fastening holes formed at a lower portion thereof for coupling the inner plate and the component module.

17. The display device of claim 16, wherein the fastening holes are configured to be externally exposed from the second cover when the component module is inserted into the space.

18. The display device of claim 17, wherein a bottom portion of the second cover is angled upward such that the fastening holes are exposed.

19. The display device of claim 1, wherein the component module further includes a thermal pad interposed between the components and the second cover and configured to transfer heat generated by the components to the second cover.

* * * * *